(12) United States Patent
Ito et al.

(10) Patent No.: US 6,902,958 B2
(45) Date of Patent: Jun. 7, 2005

(54) METHOD FOR MAKING MOSFET ANTI-FUSE STRUCTURE

(75) Inventors: Akira Ito, Irvine, CA (US); Douglas D. Smith, Mesa, AZ (US); Myron J. Buer, Gilbert, AZ (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/773,263

(22) Filed: Feb. 9, 2004

(65) Prior Publication Data

US 2004/0157379 A1 Aug. 12, 2004

Related U.S. Application Data

(63) Continuation of application No. 10/197,437, filed on Jul. 18, 2002, now Pat. No. 6,700,176.

(51) Int. Cl.[7] .......................................... H01L 21/8247
(52) U.S. Cl. ....................................................... 438/131
(58) Field of Search ................................ 438/128, 131, 438/163, 467, 600; 257/218, 221, 224, 285, 286, 336, 344, 530; 365/96, 104, 225.7

(56) References Cited

U.S. PATENT DOCUMENTS

| | | |
|---|---|---|
| 5,163,180 A | 11/1992 | Eltoukhy et al. |
| 5,306,656 A | 4/1994 | Williams et al. |
| 5,774,011 A | 6/1998 | Au et al. |
| 5,946,575 A | 8/1999 | Yamaoka et al. |
| 6,266,269 B1 | 7/2001 | Karp et al. |
| 6,326,651 B1 | 12/2001 | Manabe |
| 6,388,305 B1 | 5/2002 | Bertin et al. |
| 6,515,931 B2 | 2/2003 | Marr et al. |
| 6,518,614 B1 | 2/2003 | Breitwisch et al. |
| 6,525,955 B1 | 2/2003 | Smith et al. |
| 6,545,926 B2 | 4/2003 | Ooishi et al. |
| 6,700,176 B2 | 3/2004 | Ito et al. |
| 2001/0050407 A1 | 12/2001 | Gelsomini et al. |
| 2002/0074616 A1 | 6/2002 | Chen et al. |
| 2003/0123314 A1 | 7/2003 | Buer et al. |
| 2003/0128578 A1 | 7/2003 | Smith et al. |

FOREIGN PATENT DOCUMENTS

EP  0 495 317 A1  7/1992

OTHER PUBLICATIONS

Copy of European Search Report from EP Appl. No. 03016223.4, 4 pages (dated Nov. 20, 2003).

B. Kaczer et al., "Consistent Model for Short–Channel nMOSFET Post–Hard–Breakdown Characteristics," 2001 Symposium on VLSI *Technology Digest of Technical Papers*, pp. 121–122, 2001.

R. Degraeve et al., "Relation Between Breakdown Mode and Location in Short–Channel nMOSFETs and its impact on Reliability Specifications," IEEE, 7 pages 2001.

*Primary Examiner*—Craig A. Thompson
*Assistant Examiner*—Jennifer M Dolan
(74) *Attorney, Agent, or Firm*—Sterne, Kessler, Goldstein & Fox P.L.L.C.

(57) ABSTRACT

An anti-fuse device includes a substrate and laterally spaced source and drain regions formed in the substrate. A channel is formed between the source and drain regions. A gate and gate oxide are formed on the channel and lightly doped source and drain extension regions are formed in the channel. The lightly doped source and drain regions extend across the channel from the source and the drain regions, respectively, occupying a substantial portion of the channel. Programming of the anti-fuse is performed by application of power to the gate and at least one of the source region and the drain region to break-down the gate oxide, which minimizes resistance between the gate and the channel.

10 Claims, 7 Drawing Sheets

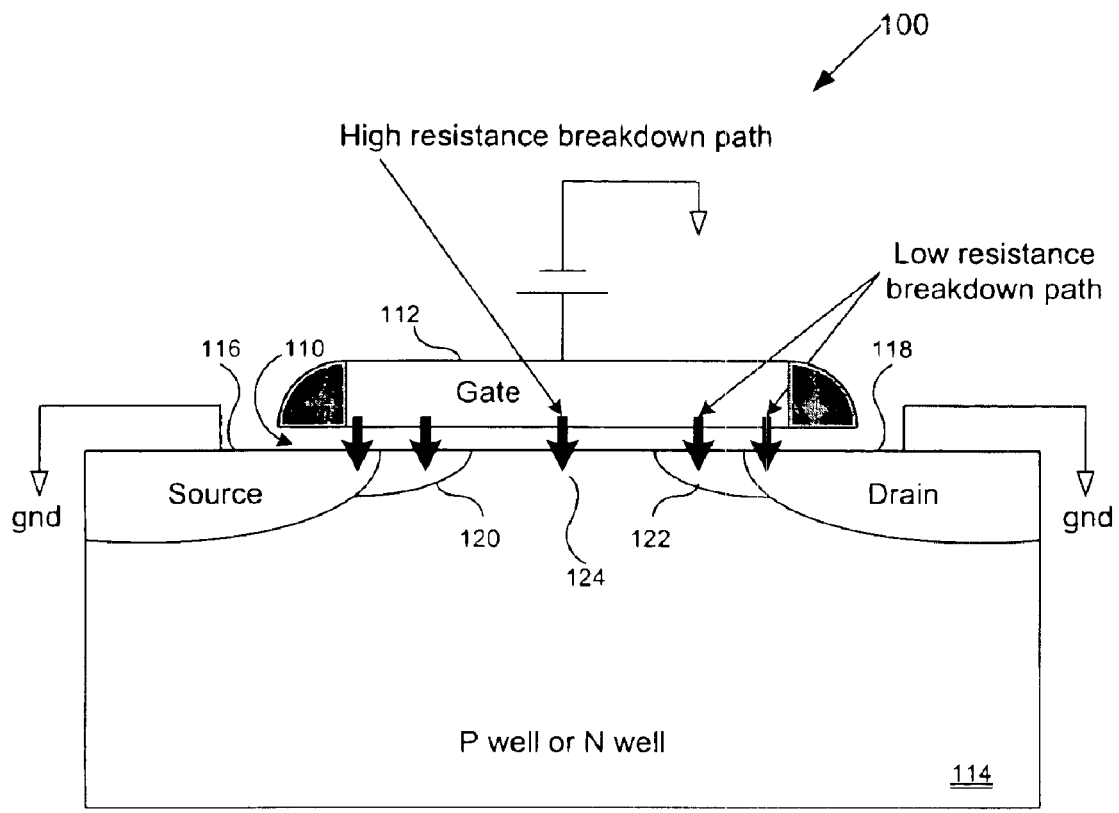
FIG. 1
(Conventional)

METHOD FOR MAKING MOSFET ANTI-FUSE STRUCTURE

CROSS REFERENCE TO RELATED APPLICATIONS

This application is a continuation of U.S. Ser. No. 10/197,437, filed Jul. 18, 2002 (now U.S. Pat. No. 6,700,176 that issued Mar. 2, 2004), entitled "MOSFET Anti-Fuse Structure," which is incorporated by reference herein in its entirety.

BACKGROUND OF THE INVENTION

1. Field of the Invention

The present invention relates to a semiconductor device, and more particularly, to a MOSFET anti-fuse.

2. Background Art

In the field of data storage, there are two main types of storage elements. The first type is volatile memory that has the information stored in a particular storage element, and the information is lost the instant the power is removed from a circuit. The second type is a nonvolatile storage element, in which the information is preserved even with the power removed. In regards to the nonvolatile storage elements, some designs allow multiple programming, while other designs allow one-time programming. Typically, the manufacturing techniques used to form nonvolatile memories are quite different from a standard logic process, which dramatically increases the complexity and chip size.

Complimentary Metal Oxide Semiconductor (CMOS) technology is the integration of both NMOS and PMOS transistors on a silicon substrate (collectively know as MOS field effect transistors, or MOSFETs). The NMOS transistor consists of a N-type doped polysilicon gate, a channel conduction region, and source/drain regions formed by diffusion of N-type dopants in the silicon substrate. The channel region separates the source from the drain in the lateral direction, whereas a layer of dielectric material that prevents electrical current flow separates the polysilicon gate from the channel. Similarly, the architecture is the same for the PMOS transistor, except a P-type dopant is used.

The dielectric material separating the polysilicon gate from the channel region, henceforth referred to as the gate oxide, usually consists of the thermally grown silicon dioxide ($SiO_2$) material that leaks very little current through a mechanism, which is called Fowler-Nordheim tunneling under voltage stress. When stressed beyond a critical electrical field (applied voltage divided by the thickness of the oxide), the transistor is destroyed by rupturing of the oxide.

Thin oxides that allow direct tunneling current behave quite differently than thicker oxides, which exhibit Fowler-Nordheim tunneling. Rupturing oxide requires determining an appropriate pulse width duration and amplitude to limit power through the gate oxide, which produces a reliable, low resistance anti-fuse.

What is desired is an anti-fuse structure that overcomes the variability of fuse resistance. Fuse resistance is much lower at edges of the source and drain regions because it is a function of breakdown spot position along the channel region. Hence, a MOSFET device without a conventional channel region is desirable to implement an anti-fuse.

BRIEF SUMMARY OF THE INVENTION

Embodiments of the present invention provide an anti-fuse device that includes a substrate and source and drain regions formed in the substrate that are laterally spaced apart to form a channel between them. The anti-fuse device also includes a gate oxide formed on the channel and a gate formed on the gate oxide. The anti-fuse also includes lightly doped source and drain extension regions formed in the channel and extending across the channel from the source and the drain regions, respectively, which occupies a substantial portion of the channel. Programming of the anti-fuse is performed by application of power to the gate and at least one of the source region and the drain region to break down the gate oxide, which minimizes resistance between the gate and the channel.

In some embodiments, the power can be electrically connected to the anti-fuse device to impress a voltage on the gate, the source region, and the drain region. Also, the source and drain regions can be coupled to a same voltage or potential during programming.

In some embodiments, the source and drain regions can be heavily doped with an N type material or heavily doped with a P type material.

In some embodiments, a deep N-well region can be formed within the substrate beneath the source and drain regions and the channel, while in other embodiments a deep P-well region can be formed.

In some embodiments, the source and the drain regions can be formed in an N-well layer that is formed on the substrate, which is doped with P type material.

In some embodiments, the lightly doped source and drain extension regions can extend completely under the gate to form an overlap region within the channel.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIG. 1 is a cross-sectional diagram illustrating a conventional MOSFET anti-fuse device.

Figure 2:
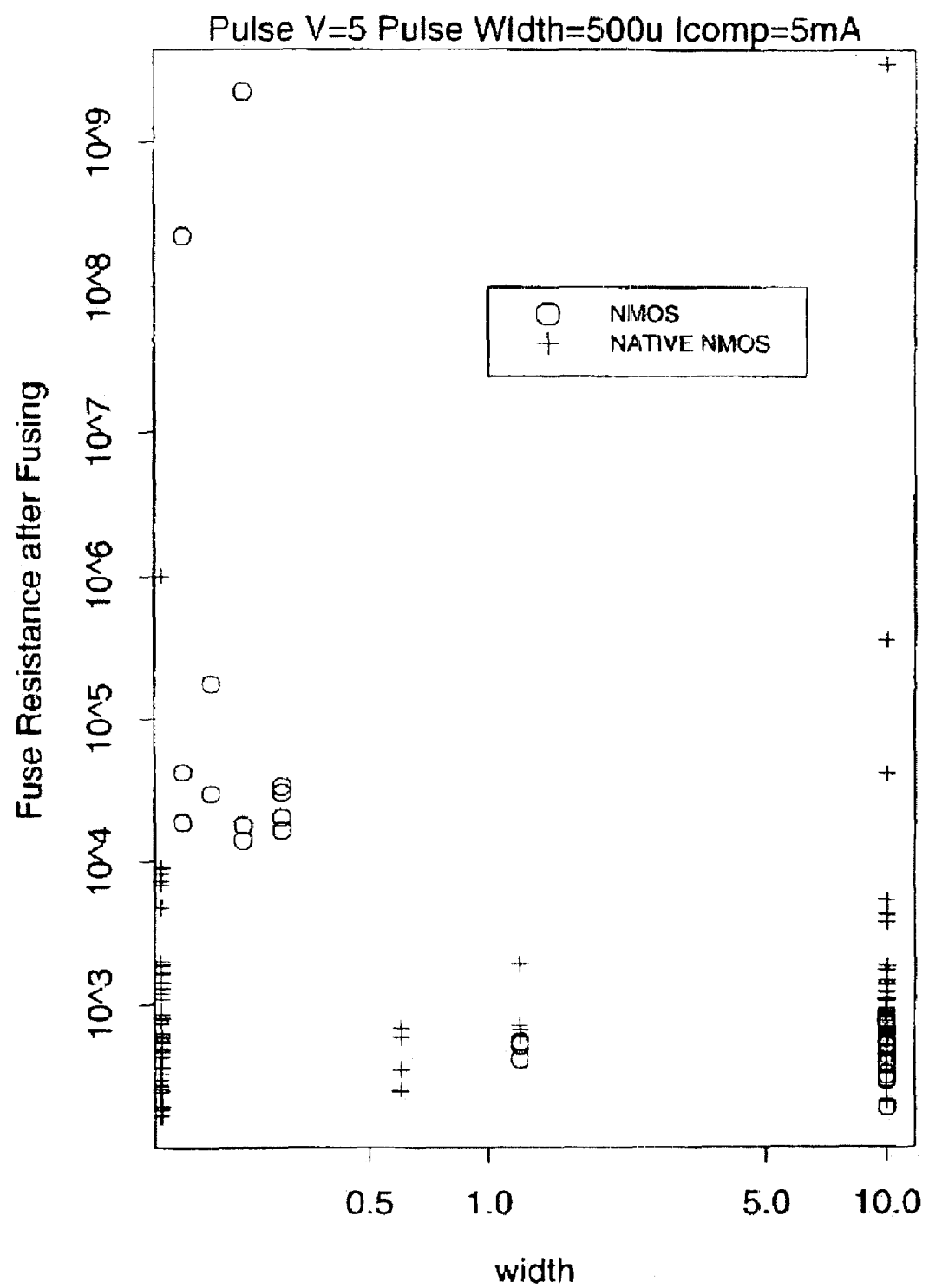
FIG. 2 is a chart comparing fuse resistance with respect to width of the MOSFET anti-fuse device in FIG. 1 with at least one of the MOSFET antifuse devices in FIGS. 3–6.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

Introduction

It should be appreciated that the particular implementations shown and described herein are examples of the invention and are not intended to otherwise limit the scope of the present invention in any way. Indeed, for the sake of brevity, conventional electronics, semiconductor manufacturing, memory technologies and other functional aspects of the devices (and components of the individual operating components of the devices) may not be described in detail herein. Furthermore, for purposes of brevity, the invention is frequently described herein as pertaining to an anti-fuse for use in electrical or electronic systems. It should be appreciated that many other manufacturing techniques could be used to create the anti-fuses described herein, and that the techniques described herein could be used as individual devices, grouped together in discrete circuits, formed in memory arrays, or integrated with other devices. Further, the techniques would be suitable for application in electrical systems, optical systems, consumer electronics, industrial electronics, wireless systems, appliances, space applications, or any other application.

The term anti-fuse and the terms storage or programmable coupled with the terms cell, element, or device are often used interchangeably in this field. The present invention is applicable to all these terns as they are generally understood in the relevant art.

The terms chip, integrated circuit, monolithic device, semiconductor device and microelectronic device are often used interchangeably in this field. The present invention is applicable to all of these terms as they are generally understood in the field.

The terms pins, pads and leads refer to input and/or output terminals of a connector, device, chip, printed circuit, or the like, which are used to provide electrical connection to one or more connectors, devices, chips, printed circuits, or the like. The present invention is applicable to all of these terms as they are generally understood in the field.

The terms metal line, trace, wire, conductor, signal path and signaling medium are all related. These related terms are generally interchangeable and appear in order from most specific to most general. In this field, metal lines are sometimes referred to as traces, wires, lines, interconnect or simply metal. Metal lines, generally aluminum (Al) or an alloy of Al and copper (Cu), are conductors which provide signal paths for coupling, or interconnecting, electrical circuitry. Conductors other than metal are available in microelectronic devices. Materials such as doped polysilicon, doped single-crystal silicon (often referred to simply as diffusion, regardless of whether such doping is achieved by thermal diffusion or ion implantation), titanium (Ti), molybdenum (Mo), or refractory metal silicides are examples of other conductors. Signaling medium is the most general term and encompasses the others.

Moreover, it should be understood that the spatial descriptions (e.g., "above", "below", "up", "down", "top", "bottom", "beneath", "across", etc.) made herein are for purposes of illustration only, and that practical anti-fuses can be spatially arranged in any orientation or manner. Arrays of these anti-fuses can also be formed by connecting them in appropriate ways and with appropriate devices.

As discussed below, the following sections more fully describe the present invention.

An anti-fuse may be formed from a conventional metal oxide semiconductor field effect transistor (MOSFET), which includes a high impedance between a gate and a source, a drain, a substrate, or a well. Gate oxide over the substrate can become a resistive short by applying a sufficient voltage, and causing part of the gate oxide to form current paths by diffusion of polysilicon gate material or silicon from the substrate. Thus, MOSFETs can be used as an anti-fuse structure by utilizing the gate oxide as a fusing element.

A cross-sectional view of a conventional MOSFET device 100 is shown in FIG. 1. MOSFET 100 comprises a gate 112 (e.g., formed of polysilicon) formed on a gate dielectric (e.g., a gate oxide) 110 (e.g., silicon dioxide, silicon nitride, or the like) over a substrate 114 (e.g., formed of silicon). Within the substrate 114 are formed source and drain regions 116,118 (e.g., heavily doped regions) and source and drain extension regions (e.g., lightly-doped regions) 120 and 122, respectively. Generally, doped regions are regions containing a higher concentration of p-type or n-type dopants than the rest of the substrate 114. The source and drain extension regions 120 and 122 generally have a lower concentration of dopants compared to the source and drain regions 116 and 118. However, the regions 116, 118, 120 and 122 can be doped to the same levels. The region in the substrate directly below the gate 112, and between source and drain extension regions 120 and 122, is typically referred to as a channel region 124.

Resistive current paths can be formed between the gate 112, the channel region 124, or the source and drain extension regions 120, 122. The lowest resistance paths tend to be between the gate 112 and the source or drain regions 116, 118 and the source or drain extension regions 120, 122. However, when the resistive current paths are formed from the gate electrode 112 to the substrate 114, which can comprise a P-well or N-well, the fuse resistance is much higher. Examples of this are taught in Robin Degraeve, et al., "Relation Between Breakdown Mode and Location in Short-Channel nMOSFETs and its Impact on Reliability Specifications," in *Symposium on VLSI Technology Digest of Technical Papers* (June 2001), and B. Kaczer, et al., "Consistent Model for Short-Channel nMOSFET Post-hard-breakdown Characteristics," in *Symposium on VLSI Technology Digest of Technical Papers* (June 2001), which are incorporated by reference herein in their entirety. These articles discuss that soft breakdown (i.e., high fuse resistance) and hard breakdown (i.e., low fuse resistance) are influenced by a breakdown spot position. The soft breakdowns almost exclusively occur between the gate 112 and channel region 124 (i.e., substrate, N-well, or P-well).

Both high resistance and low resistance breakdown paths are illustrated in FIG. 1. Breakdown of the gate dielectric 110 is caused by application of a voltage (Vg) to gate 112, while source 116 and drain 118 are grounded. Generally, programming and sensing of anti-fuse devices, and the associated circuits to perform these operations, are well known to persons having ordinary skill in the art. Metal lines, polysilicon-doped regions, or the like, are used to couple the drain and source regions to ground for programming, or to a sense circuit for determining the state of the anti-fuse.

For anti-fuse applications, the soft breakdowns are undesirable because fuse resistance distribution is considerably higher than that of the hard breakdown. Also, as shown in FIG. 2, the fuse resistance of the conventional MOSFET anti-fuse device initially decreases with width, but begins to increase with a further decrease in width for a given power supply applied to the anti-fuse. Furthermore, the variability of the fuse resistance increases with a decrease in width. In particular technologies, in order to achieve a high density memory cell or redundancy or error correction, the fuse structure should be as small as possible. Thus, conventional MOSFET anti-fuse devices are not suitable to provide for a small structure of a high density memory cell, redundancy, or error correction due to variability of the fuse resistance and increase in fuse resistance.

The present invention is directed to a device and associated manufacturing method that overcome these above-noted deficiencies in conventional MOSFET anti-fuses.

Figure 3:
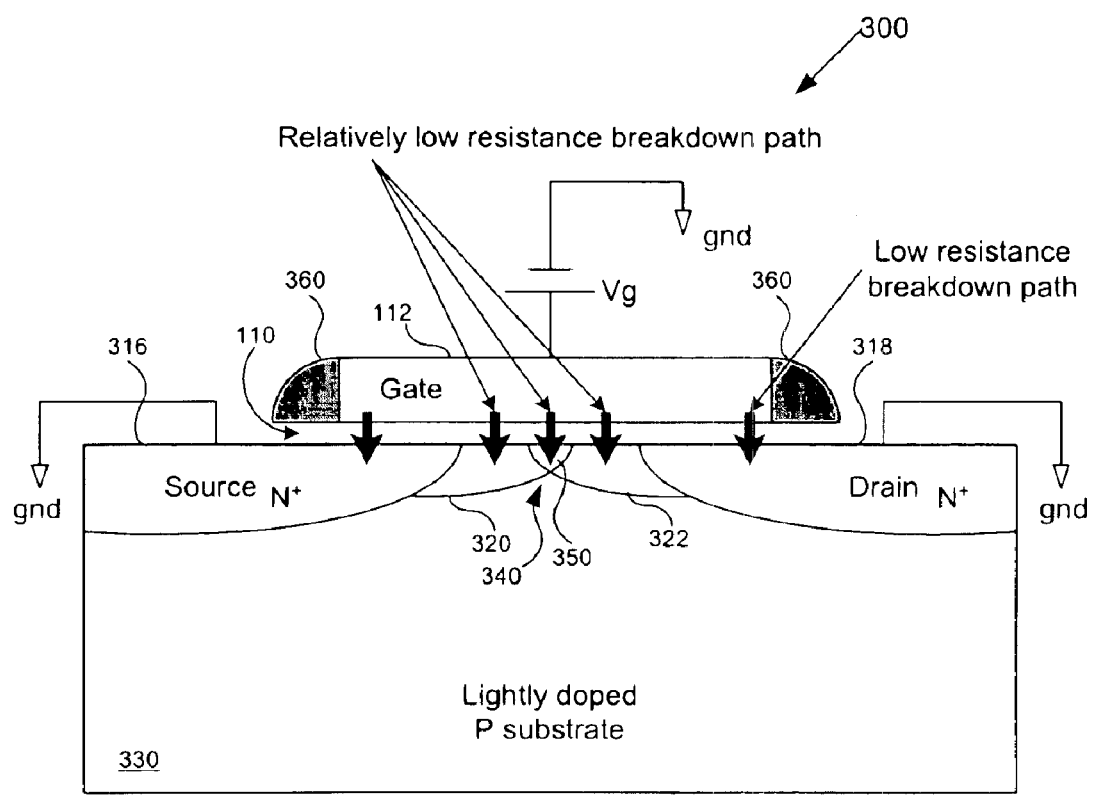
FIG. 3 is a cross-section diagram illustrating a MOSFET anti-fuse device according to embodiments of the present invention.

FIG. 3 illustrates a cross-section of a MOSFET anti-fuse device 300 according to an embodiment of the present invention. Gate 112 is formed on gate dielectric 110, and is located above source and drain extension regions 320 and 322 and source and drain regions 316 and 318, which are formed in a lightly doped P-type substrate 330. Doping is performed by ion implantation or other doping techniques, and activation annealing, as would be apparent to persons having ordinary skill in the relevant art. The doping of device 300 is used to control the characteristics of a channel region 340.

In one embodiment, source-drain extension regions 320, 322 are formed by introducing dopants into the substrate 330 on either side of the gate 112, often with a known ion implantation technique. For instance, a low dose of N or P type dopants are implanted into the substrate. The source-drain extension regions 320, 322 are formed in the channel 340 and extend or diffuse across the channel 340 to thereby occupy a substantial portion of the channel 340. The substantial portion of the channel 340 that the source-drain extension regions 320, 322 occupy is defined by where they extend toward a middle portion of the channel 340. In case of a short channel device, the source-drain extension regions 320, 322 diffuse into each other forming an overlapped region 350 within the channel 340.

Once the source-drain extension regions 320, 322 are formed, a spacer forming material, such as nitride or oxide, is deposited and anisotropically etched to form spacers 360, which abut the sidewalls of the gate 112. Then, a higher level dopant is introduced (e.g., by ion implantation) to form source and drain regions 316, 318. Further processing can be performed, as would be apparent to persons having ordinary skill in the art.

The anti-fuse device 300 is normally an open circuit until a programming current (e.g., about 5 mA in a 0.13µ CMOS process, although an optimal current can depend on specific device geometries) is forced through the gate 112. By applying the gate voltage Vg to the gate 112, a resulting current will cause the anti-fuse device 300 to break down or "blow." Once the anti-fuse device 300 is permanently blown, it acts as a closed circuit. Blowing the anti-fuse can also be referred to as "programming" the device. The gate oxide is ruptured, thereby shorting a portion of the gate 112 to the underlying channel 340, which provides a low resistance between the gate 112 and the source region 316, drain region 318, and the substrate 330. The channel structure 340 (including lightly-doped regions 320 and 322) provides a more desirable, predictably consistent resistance as compared to conventional CMOS anti-fuse devices discussed above.

Figure 4:
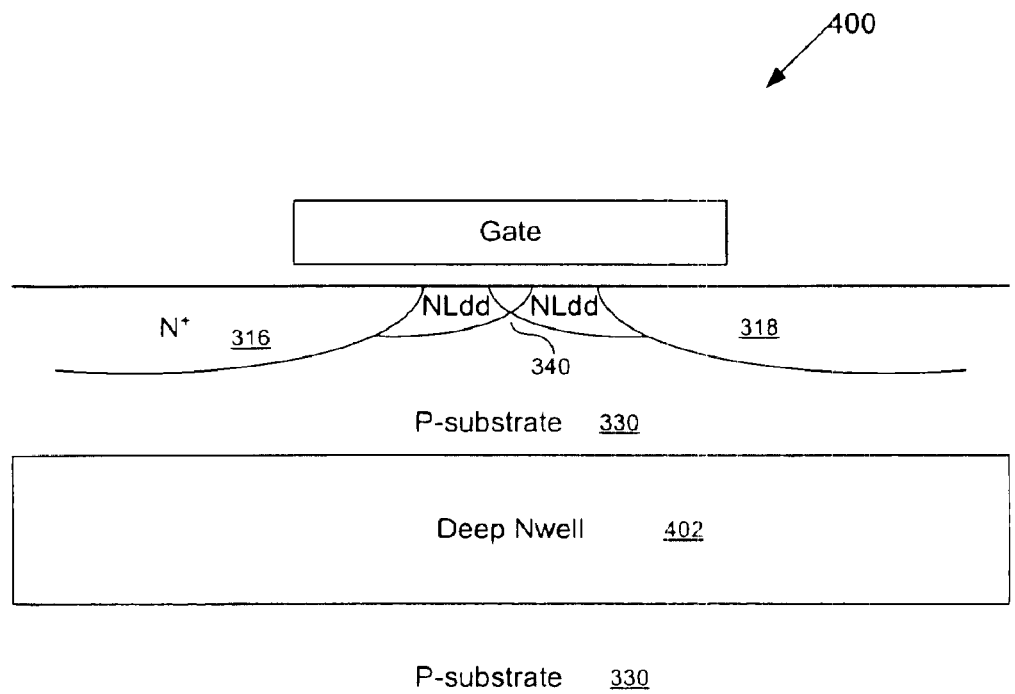
FIG. 4 is a cross-section diagram illustrating a MOSFET anti-fuse device according to embodiments of the present invention.
Figure 5:
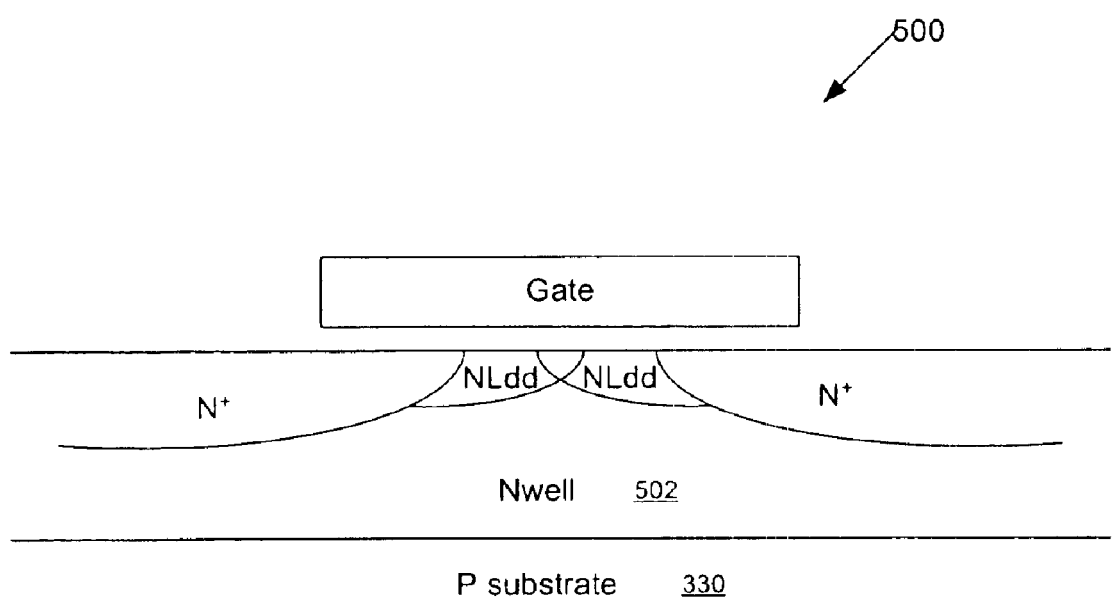
FIG. 5 is a cross-section diagram illustrating a MOSFET anti-fuse device according to embodiments of the present invention.
Figure 6:
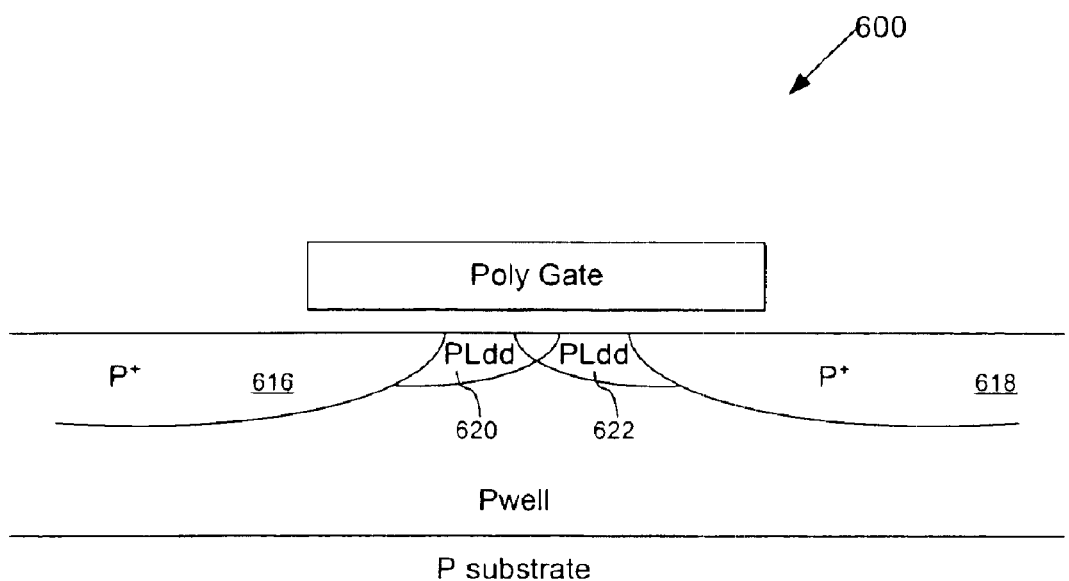
FIG. 6 is a cross-section diagram illustrating a MOSFET anti-fuse device according to embodiments of the present invention.

FIG. 4 illustrates a MOSFET anti-fuse device 400 according to embodiments of the present invention. This embodiment is similar to FIG. 3, but includes a deep N-well region 402, which is formed within the lightly doped P-type substrate 330 beneath the source and drain regions 316, 318 and the channel 340. In FIGS. 4–6, Ldd refers to "lightly doped drain," although both the source and drain contain the same label. The N or P before the Ldd refers to the type of doping. Although not shown, all the regions can have opposite dopants.

FIG. 5 illustrates a MOSFET anti-fuse device 500 according to embodiments of the present invention. This embodiment is similar to FIG. 3, but includes an N-well 502 formed of an epitaxial layer on a lightly doped P-type substrate 330.

FIG. 6 illustrates a MOSFET anti-fuse device 600 according to embodiments of the present invention. This embodiment is similar to FIG. 3, but source and drain regions 616 and 618, source/drain extension regions 620 and 622, well region P-well, and the substrate are all of the same conductivity type (e.g., P-type). The substrate can be either a P-type substrate or a lightly-doped P-type substrate. In alternative embodiments, although not shown, the regions could all be doped with N-type materials.

Figure 7:
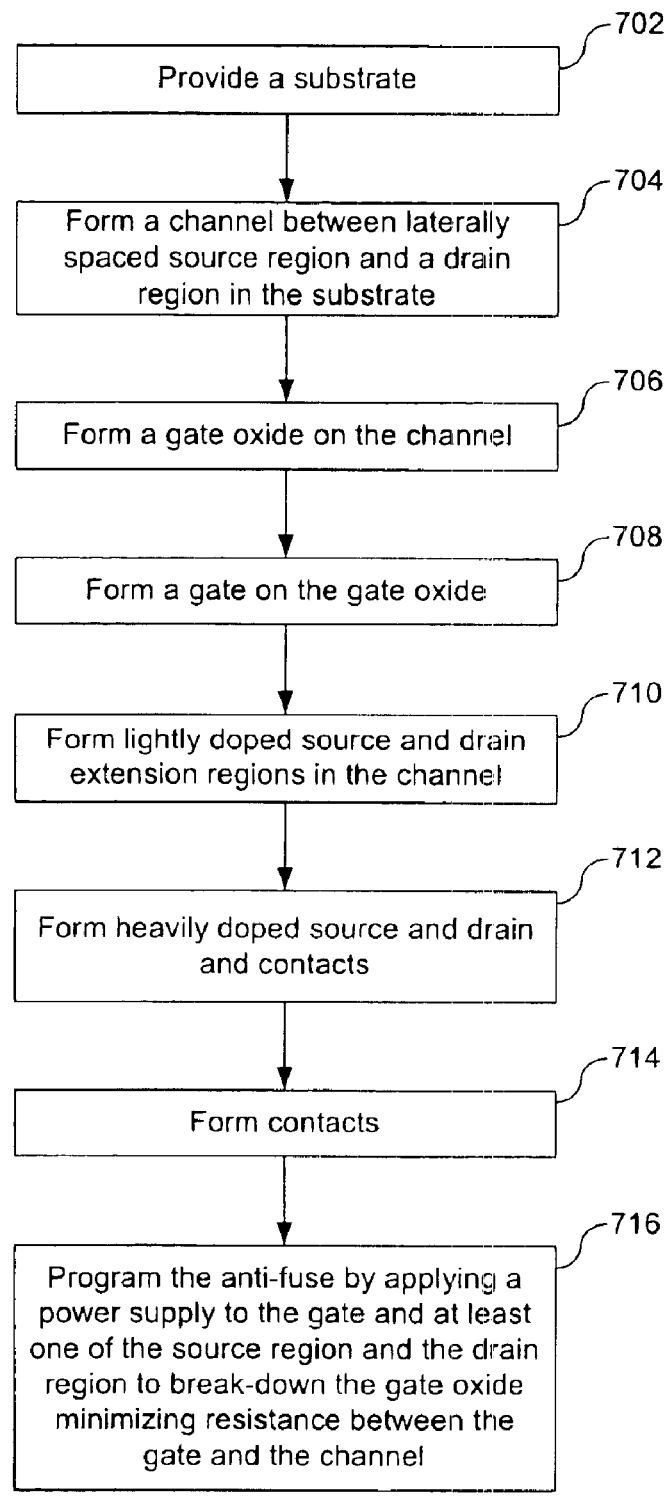
FIG. 7 is a flowchart illustrating a method to reduce on-state resistance and improving current characteristics of the MOSFET anti-fuse device, in according to embodiments of the present invention.

FIG. 7 illustrates a flow chart showing a method 700 for reducing on-state resistance and improving current characteristics of an anti-fuse device, according to embodiments of the present invention. At step 702, a substrate is provided, which can be a lightly doped P-type substrate. At step 704, laterally spaced source and drain regions, and a channel there between, are formed in the substrate. In some embodiments, the source and drain regions are doped with N-type material, while in other embodiments the source and drain regions are doped with P-type material. At step 706, a gate oxide is formed on the channel. At step 708, a gate is formed on the gate oxide. At step 710, lightly doped source and drain extension regions are formed in the channel. At step 712, heavily doped source and drain regions are formed in the channel. At step 714, contacts are formed. At step 716, the anti-fuse device is programed.

It is to be appreciated that in some embodiments, the programming is performed by application of power to the gate and at least one of the source region and the drain region to break down the gate oxide minimizing resistance between the gate and the channel. Also, in some embodiments, a deep N-well region is formed within the substrate beneath the source and drain regions and the channel. In other embodiments, the source and drain regions are formed in an N-well layer that is formed on the substrate, which is doped with P type material. In still further embodiments, the lightly doped source and drain extension regions are formed completely under the gate to form an overlap region within the channel.

As with the anti-fuse device 300, devices 400, 500 and 600 also reduce on-state resistance and improve current characteristics when blown, according to the present invention.

An advantage of the present invention is the compact nature of nonvolatile one-time programming anti-fuse devices, which can be manufactured using standard 0.13 µm or other CMOS processes. Thus, integrating multitudes of anti-fuses on a single IC can be achieved according to the present invention.

Additionally, the anti-fuse devices of the present invention minimize resistance variances between blown anti-fuse devices and are optimized with small chip area utilization. The anti-fuse devices of the present invention require a lower programming current than conventional CMOS devices.

One intended use is in the area of post package programming to install security codes. The codes cannot be electrically altered or decoded without destroying the circuitry. Alternatively, the anti-fuse capacitor/transistor can be used as memory elements in programmable logic devices and read only memory devices.

The present invention can be implemented with various changes and substitutions to the illustrated embodiments. For example, the present invention may be implemented on substrates comprised of materials other that silicon, such as, for example, gallium arsenide or sapphire.

Conclusion

While various embodiments of the present invention have been described above, it should be understood that they have been presented by way of example, and not limitation. It will be apparent to persons skilled in the relevant art(s) that various changes in form and detail can be made therein without departing from the spirit and scope of the invention. Thus the present invention should not be limited by any of the above-described exemplary embodiments, but should be defined only in accordance with the following claims and their equivalents.

What is claimed is:

1. A method of programming an anti-fuse device, comprising:

forming a channel between a source region laterally spaced from a drain region in a substrate;

forming a gate oxide on the channel;

forming a gate on the gate oxide;

forming lightly doped source and drain extension regions in the channel that cumulatively occupy substantially all of the channel before programming of the anti-fuse device; and programming the anti-fuse device through application of power to the gate and one of the source region and the drain region, such that the gate oxide is broken down and resistance between the gate and the channel is minimized.

2. The method of claim 1, further comprising providing a lightly doped P-type substrate as the substrate.

3. The method of claim 1, further comprising doping the source and drain regions with N-type material.

4. The method of claim 1, further comprising doping the lightly doped source and drain extension regions with N-type material.

5. The method of claim 1, further comprising doping the source and drain regions with P-type material.

6. The method of claim 1, further comprising doping the lightly doped source and drain extension regions with P-type material.

7. The method of claim 1, further comprising forming a deep N-well region in the substrate below the source region, the drain region, and the channel.

8. The method of claim 1, further comprising forming a deep P-well region in the substrate below the source region, the drain region, and the channel.

9. The method of claim 1, further comprising:

doping the substrate with P-type material; and forming the source and the drain regions in an N-well region formed in the substrate.

10. The method of claim 1, further comprising forming an overlap region within the channel, wherein the overlap region includes the lightly doped source and drain extension regions.

* * * * *